US011575318B2

(12) United States Patent
Hsu et al.

(10) Patent No.: US 11,575,318 B2
(45) Date of Patent: Feb. 7, 2023

(54) VOLTAGE CONVERTERS WITH HYSTERETIC CONTROL

(71) Applicant: Microchip Technology Incorporated, Chandler, AZ (US)

(72) Inventors: Alex Hsu, Hong Kong (HK); Paolo Nora, Belgioioso (IT)

(73) Assignee: Microchip Technology Incorporated, Chandler, AZ (US)

( * ) Notice: Subject to any disclaimer, the term of this patent is extended or adjusted under 35 U.S.C. 154(b) by 21 days.

(21) Appl. No.: 16/947,785

(22) Filed: Aug. 17, 2020

(65) Prior Publication Data

US 2021/0083579 A1    Mar. 18, 2021

(30) Foreign Application Priority Data

Sep. 16, 2019 (CN) .......................... 201910870625.6

(51) Int. Cl.
*H02M 3/15* (2006.01)
*H02M 3/158* (2006.01)
*H02M 1/088* (2006.01)
*H03K 3/037* (2006.01)
*H03K 19/20* (2006.01)
*H02M 1/00* (2006.01)

(52) U.S. Cl.
CPC .......... *H02M 3/158* (2013.01); *H02M 1/088* (2013.01); *H03K 3/037* (2013.01); *H03K 19/20* (2013.01); *H02M 1/0048* (2021.05)

(58) Field of Classification Search
CPC .... H02M 3/158; H02M 1/0048; H02M 1/088; H03K 3/037; H03K 19/20
See application file for complete search history.

(56) References Cited

U.S. PATENT DOCUMENTS 5,617,016 A  *  4/1997  Borghi ................. H02M 3/156
                                                                323/284
2002/0075705 A1 *  6/2002  Bayer .................. H02M 3/073
                                                                363/59

(Continued)

OTHER PUBLICATIONS

German First Office Action for Chinese Application No. 102020124122.4, dated Apr. 28, 2022, 14 pages with translation.

*Primary Examiner* — Yemane Mehari
(74) *Attorney, Agent, or Firm* — TraskBritt

(57) ABSTRACT

Various embodiments relate to a voltage converter including a control unit configured for operating in a hysteretic control mode. A control unit may be configured to receive a PWM signal, a duty cycle signal, at least one reference voltage, a factor of an output voltage of the voltage converter, and a factor of an input voltage of the voltage converter. The control unit may also be configured to compare the at least one reference voltage to the factor of the output voltage and the factor of the input voltage. Further, the control unit may be configured to generate a first control signal mirroring the PWM signal in response to at least one of: the factor of the input voltage being greater than the at least one reference voltage and the factor of the output voltage being greater than the at least one reference voltage. The control unit may also be configured to generate a second, different control signal including a low logic signal in response to the factor of the input voltage being less than or equal to the at least one reference voltage.

20 Claims, 8 Drawing Sheets

(56) References Cited

U.S. PATENT DOCUMENTS

| | | | |
|---|---|---|---|
| 2010/0026263 A1 | 2/2010 | Moussaoui et al. | |
| 2011/0241641 A1* | 10/2011 | Chen | H02M 3/1588 |
| | | | 323/284 |
| 2013/0038227 A1* | 2/2013 | Yan | H05B 45/3725 |
| | | | 315/186 |
| 2019/0008154 A1 | 1/2019 | Mathieson et al. | |
| 2019/0081546 A1* | 3/2019 | Hsu | H02M 3/158 |
| 2021/0083579 A1* | 3/2021 | Hsu | H03K 7/08 |

\* cited by examiner

VOLTAGE CONVERTERS WITH HYSTERETIC CONTROL

PRIORITY CLAIM

This application claims the benefit of the filing date of Chinese Patent Application Serial No. 201910870625.6, filed Sep. 16, 2019, the disclosure of which is hereby incorporated herein in its entirety by this reference.

TECHNICAL FIELD

The embodiments described herein relate, generally, to voltage converters, and more specifically, to voltage converters with hysteretic control. Yet more specifically, various embodiments relate to voltage converters with hysteretic control for bypass mode transitions.

BACKGROUND

Voltage converters, such as switched-mode power supplies, are widely used in a variety of electronic equipment, including computers and other sensitive equipment requiring a stable and efficient power supply. A switched-mode power supply (SMPS) includes a switching device (e.g., a MOSFET) that is turned on and off at high frequencies to convert power. The SMPS further includes one or more storage components (e.g., inductors and/or capacitors) to supply power (e.g., to a load) when the switching device is in a non-conductive state.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1B:
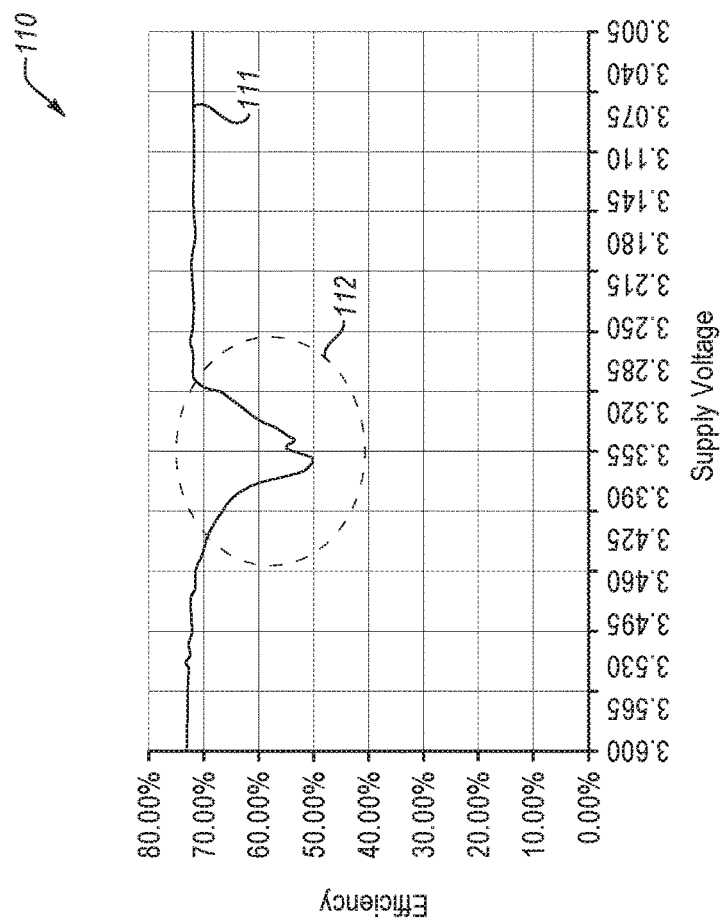
FIG. 1B shows a plot including a waveform indicative of an efficiency of a voltage converter across a supply voltage.

Various embodiments disclosed herein are related to control units, and to voltage converters including control units. In at least some embodiments, a control unit may be configured to increase an efficiency of a voltage converter during a bypass transition, such as a transition from an operating mode (e.g., pulse-frequency modulation (PFM) mode) to a bypass mode, or a transition from a bypass mode to another operating mode (e.g., a PFM mode). More specifically, various embodiments are related to operating a voltage converter in a hysteretic control mode while the voltage converter transitions from a PFM mode to a bypass mode. Stated another way, various embodiments are related to a voltage converter configured to transition from a PFM mode to a bypass mode through a hysteretic control mode or from a bypass mode to the PFM mode through the hysteretic control mode.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawing could be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As will be appreciated by a person having ordinary skill in the art, a voltage converter (e.g., a buck converter) may operate in a continuous conduction mode (CCM) during heavy load conditions using pulse-width modulation (PWM). Further, during light load conditions, a voltage converter may operate in a discontinuous conduction mode (DCM). Efficiency at light load conditions in voltage converters (e.g., switch mode power supplies (SMPS)) is generally improved by an SMPS controller using a pulse-frequency modulation (PFM) mode instead of the more standard pulse-width modulation (PWM) mode. PWM may provide enhanced output voltage regulation, however PFM may provide greater efficiency at light current loads. Unfortunately, a side effect of PFM is a larger output ripple voltage that may reduce voltage output accuracy. When power conversion is not necessary and/or desired, a voltage converter may operate in a bypass mode, wherein an input power is directly coupled to an output of the voltage converter.

As will be appreciated, in some voltage converters, when approaching a bypass mode (e.g., from a PFM mode), a voltage ramp (e.g., Vramp) may be clamped by a pulse that is synchronized to an oscillator, and with such a synchronized modulation, switching activity may increase a quiescent current (IQ) of the voltage converter and reduce light-load efficiency performance. Further in some conventional voltage converters, to generate a constant output voltage, switching activity may be undesirably increased while approaching the bypass mode (e.g., from a PFM mode), and/or after transitioning out of the bypass mode (e.g., into the PFM mode).

As described more fully herein, according to various embodiments of the disclosure, a hysteretic control mode (HCM) may be used to extend an on-duty time of a voltage converter while the voltage converter transitions toward a bypass mode and/or after the voltage converter transitions out of the bypass mode. More specifically, according to various embodiments, if the voltage converter is operating in the PFM mode, in response to a trigger (e.g., a supply voltage of a voltage converter decreasing to a value less than or equal to a threshold voltage), a HCM may be activated (i.e., the voltage converter may transition from the PFM mode to a HCM). In the HCM, rather than conveying a pulse-width modulation (PWM) signal to a pulse generator (i.e., as would occur if the voltage converter was operating in the PFM mode), a static signal (e.g., a static low or a static high signal) is conveyed to the pulse generator to prevent high-side transistor switching. Further, according to some embodiments, after transitioning to the HCM mode, and in response to another trigger (e.g., an output voltage of the voltage converter increasing to a value equal to or greater than another threshold voltage), HCM may be deactivated (i.e., the voltage converter may transition from the HCM to the PFM mode). As noted above, in the HCM, rather than conveying a PWM signal to a pulse generator (i.e., as would occur if the voltage converter was operating in the PFM mode), a static signal is conveyed to the pulse generator to prevent high-side transistor switching.

Thus, in contrast to conventional voltage converters that may exhibit increased switching activity while approaching a bypass mode, the HCM conveys a static signal to a pulse generator, and thus an "on duty" time is extended and undesirable switching of a high-side transistor is prevented (i.e., while the voltage converter approaches the bypass mode). Further, in contrast to conventional voltage converters that may exhibit increased switching activity after transitioning out of the bypass mode (e.g., into a PFM mode), the HCM conveys a static signal to a pulse generator, and thus an "on duty" time is extended and undesirable switching of a high-side transistor is prevented.

Figure 1A:
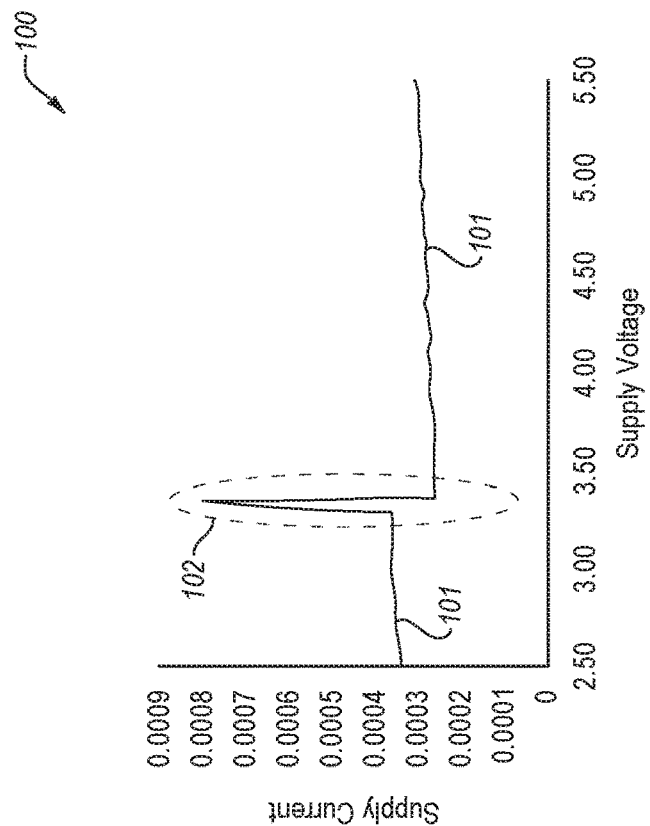
FIG. 1A shows a plot including a waveform indicative of a voltage converter supply current across a supply voltage.

For example, FIG. 1A shows a plot 100 including a waveform 101 indicative of a supply current across a supply voltage (also referred to herein as an "input voltage") for a conventional voltage converter. Further, FIG. 1B shows a plot 110 including a waveform 111 indicative of an efficiency of the conventional voltage converter across the supply voltage. At a supply voltage around approximately 3.3 volts (i.e., where the desired output voltage is approximately the same as the supply voltage), the supply current increases (as indicated by reference numeral 102 in FIG. 1A), and thus the efficiency of the voltage converter decreases (as indicated by reference numeral 112 in FIG. 1B).

As noted above, various embodiments disclosed herein may increase an efficiency of a voltage converter by reducing current consumption. More specifically, various embodiments may increase an efficiency of a voltage converter during a bypass transition, such as a transition from an operating mode (e.g., a pulse-frequency modulation (PFM) mode) to a bypass mode, or a transition from a bypass mode to another operating mode (e.g., a PFM mode).

Figure 2:
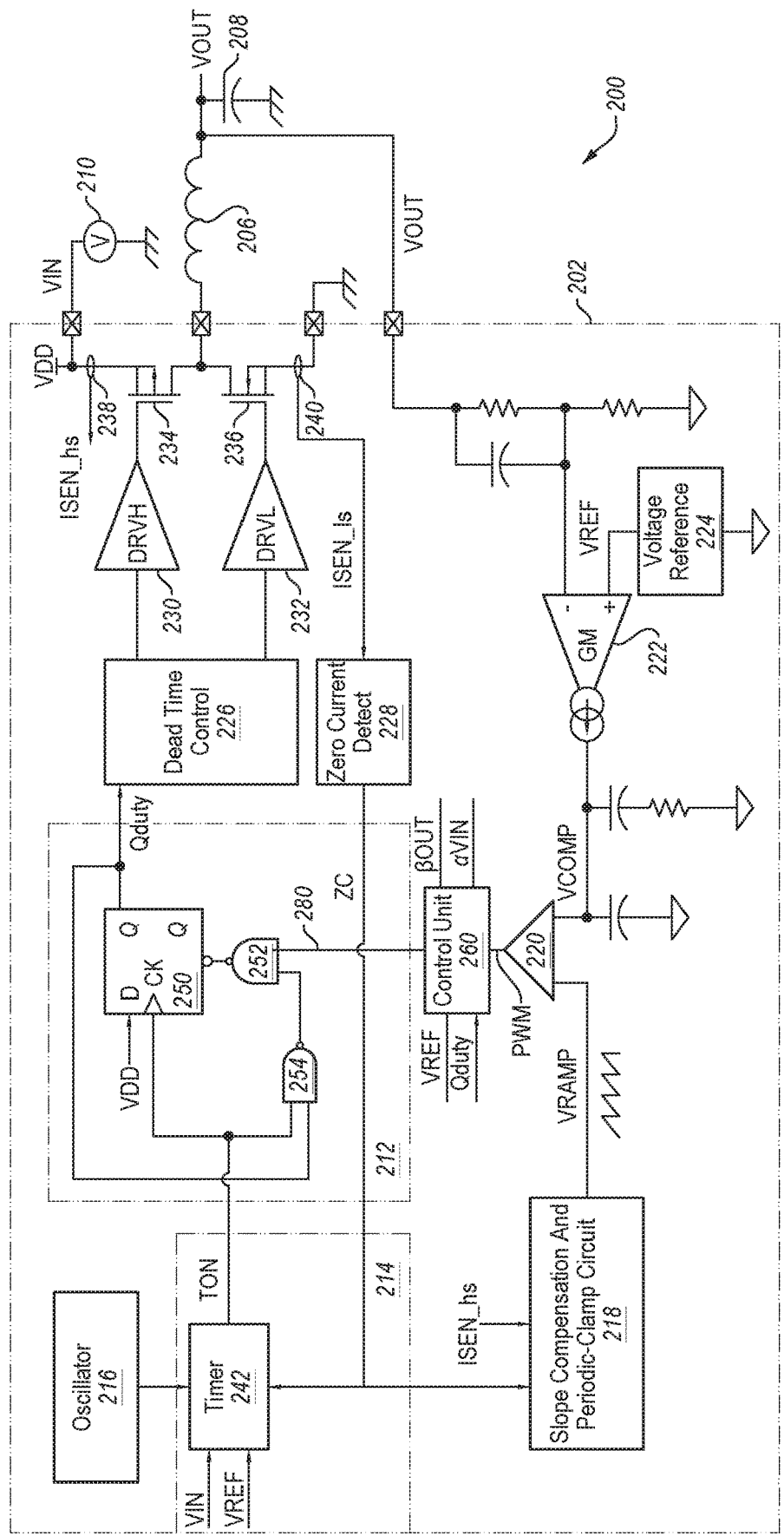
FIG. 2 is a block diagram of a voltage converter, according to various embodiments of the disclosure.

FIG. 2 is a block diagram illustrating a voltage converter 200, according to various embodiments of the disclosure. Voltage converter 200, which may also referred to herein as a "switched-mode power supply" (SMPS), includes an adaptive duty controller power driver 202, a power inductor 206, a load filter capacitor 208, and a voltage supply 210 for providing an input voltage VIN. Voltage converter 200 is configured to generate an output voltage VOUT.

Adaptive duty controller power driver 202 includes a pulse generator 212, an on-duty generator 214, an oscillator 216, slope compensation and periodic-clamp circuit 218, a voltage comparator 220 (e.g., with hysteresis), an operational transconductance amplifier 222, and a voltage reference generator (e.g., a digital-to-analog converter (DAC)) 224 (e.g., to generate a reference voltage VREF). Adaptive duty controller power driver 202 further includes a dead time control circuit 226, a zero current detector 228, a high-side transistor driver 230, a low-side transistor driver 232, a high-side power transistor 234, a low-side power transistor 236, a high-side current sensor 238 (e.g., for sensing a high-side current), and a low-side current sensor 240 (e.g., for sensing a low-side current). For example, power transistors 234 and 236 may include metal oxide semiconductor field effect transistors (MOSFETs), P-channel and N-channel, respectively. A high-side current value ISEN_hs may be supplied to slope compensation and periodic-clamp circuits 218, and a low-side current value ISEN_ls may be supplied to zero current detector 228.

Dead time control circuit 226 is configured to prevent current shoot-through in power transistors 234 and 236, and zero-current detector 228 is configured to determine when substantially no current is flowing through power inductor 206 (i.e., by monitoring a signal (e.g., low-side current value ISEN_ls) from low-side current sensor 240).

Pulse generator 212 includes a flip-flop 250 and NAND gates 252 and 254. On-duty generator 214 comprises a timer 242 that is configured to receive input voltage VIN, reference voltage VREF, and a zero current (ZC) signal from zero current detector 228.

As described more fully below, voltage converter 200 includes a control loop for transitioning into and out of a bypass mode (i.e., wherein transistor 234 is continuously ON and a 100% duty cycle is achieved). More specifically, for example, on-duty generator 214 is configured to receive input voltage VIN and reference voltage VREF. Further, in some embodiments, timer 242 may determine a target output voltage based on the reference voltage VREF. In other embodiments, the target output voltage may be provided to timer 242. As will be appreciated by a person having ordinary skill in the art, based on input voltage VIN and the target output voltage, timer 242 may generate a control signal TON that is synchronized to oscillator 216. Control signal TON may include an "on time" that is determined based on an operating state of voltage converter 200 (i.e., input voltage VIN and the target output voltage). More specifically, as will be appreciated, control signal TON may be asserted based on a current through inductor 206. Further, on-duty generator 214, and more specifically timer 242, may estimate a required pulse width of control signal TON depending on the ratio of the target output voltage (e.g., determined via reference voltage VREF) to input voltage VIN. In one embodiment (not shown) the instantaneous output voltage VOUT to input voltage VIN may be monitored by on-duty generator 214 and the estimate of the required pulse with of control signal TON may be responsive thereto. Bypass mode is asserted by on-duty generator 214 with a fixed control signal TON being high, and is de-asserted by on-duty generator 214 when control signal TON again begins to vary so as to attempt to shut off high-side transistor 234.

Flip-flop 250 is configured to receive a supply voltage VDD at a D input thereof, control signal TON at a clock input thereof, and an output of NAND gate 252 at a reset input, and generate a duty cycle signal Qduty for controlling the duty cycle of voltage converter 200. In response to control signal TON transitioning to a logic high, duty cycle signal Qduty will transition high. Duty cycle signal Qduty may be coupled to the gate of the high-side power transistor 234 (i.e., via the dead time control circuit 226 and the high side transistor driver 230), and duty cycle signal Qduty when high may cause transistor 234 to turn ON, thereby coupling voltage supply 210 to a first end of inductor 206. As will be appreciated, duty cycle signal Qduty may transition high in response to a rising edge of control signal TON, and duty cycle signal Qduty may be reset in response to control signal TON transitioning low and a high control signal 280 received via NAND gate 252.

Output voltage VOUT appearing at a second end of inductor 206 and across load filter capacitor 208 is coupled through a voltage divider to operational transconductance amplifier 222, which is configured to provide a voltage VCOMP that represents output voltage VOUT divided by the voltage divider minus reference voltage VREF. It is noted that at DC, an output resistance of transconductance amplifier 222 may absorb the signal current, thus creating voltage VCOMP, which is representative of an error signal at an input of transconductance amplifier 222. It is noted that implementation of an error amplifier (e.g., in analog power conversion circuits) via transconductance (i.e., current source) stages is common due to, for example, benefits in terms of noise sensitivity and/or stability vs. capacitive loading.

As will be appreciated, slope compensation and periodic-clamp circuit 218 is configured to generate a voltage VRAMP (e.g., having a sawtooth waveform), and comparator 220 generates a pulse-width modulation (PWM) signal PWM based on a comparison of voltage VRAMP with voltage VCOMP.

Operation of pulse generator 212, on-duty generator 214, slope compensation and periodic-clamp circuit 218, dead time control circuit 226, and zero current detector 228 is known in the art, and some specific details regarding these components may not be discussed in further detail. For example only, U.S. Patent Publication No. US2019/0081546 discloses a voltage converter including a pulse generator, an on-duty generator, a slope compensation and periodic-clamp circuit, a dead time control circuit, and a zero current detector. Patent Publication No. US2019/0081546, assigned to the assignee of the present disclosure is incorporated herein in its entirety by this reference.

Figure 3:
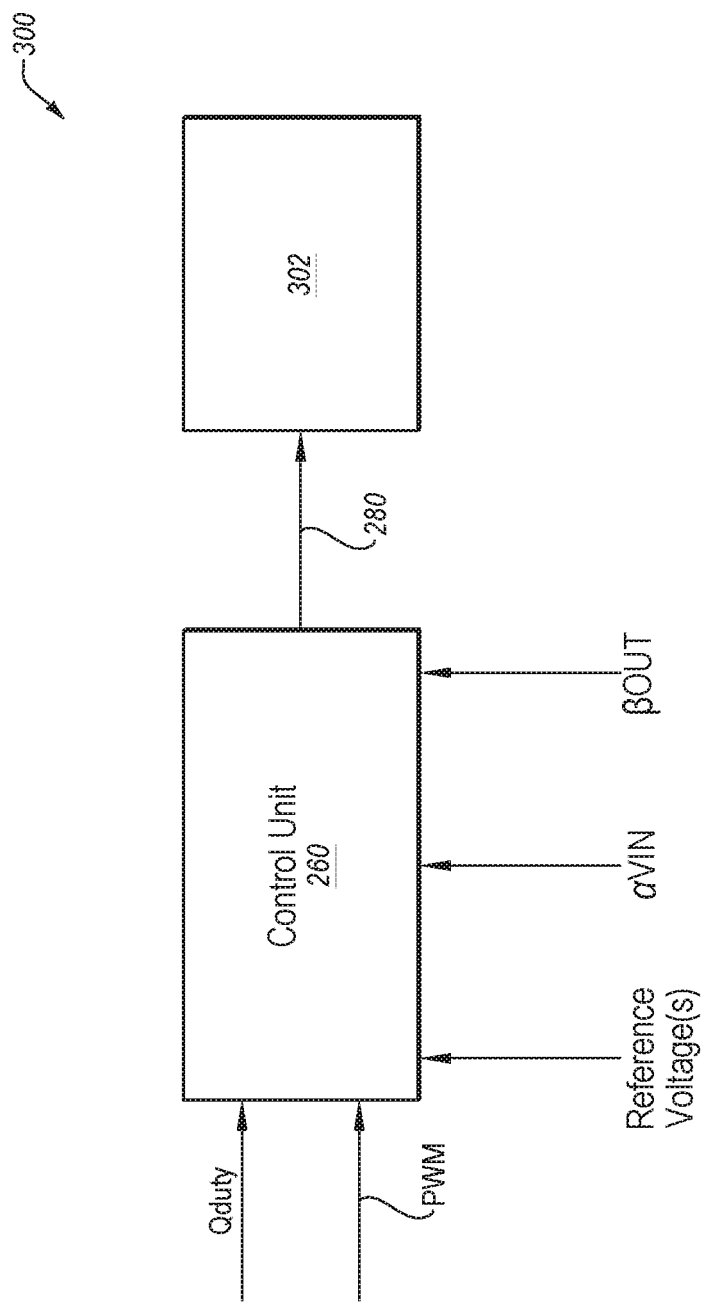
FIG. 3 is a simplified block diagram of a voltage converter, in accordance with various embodiments of the disclosure.
Figure 4:
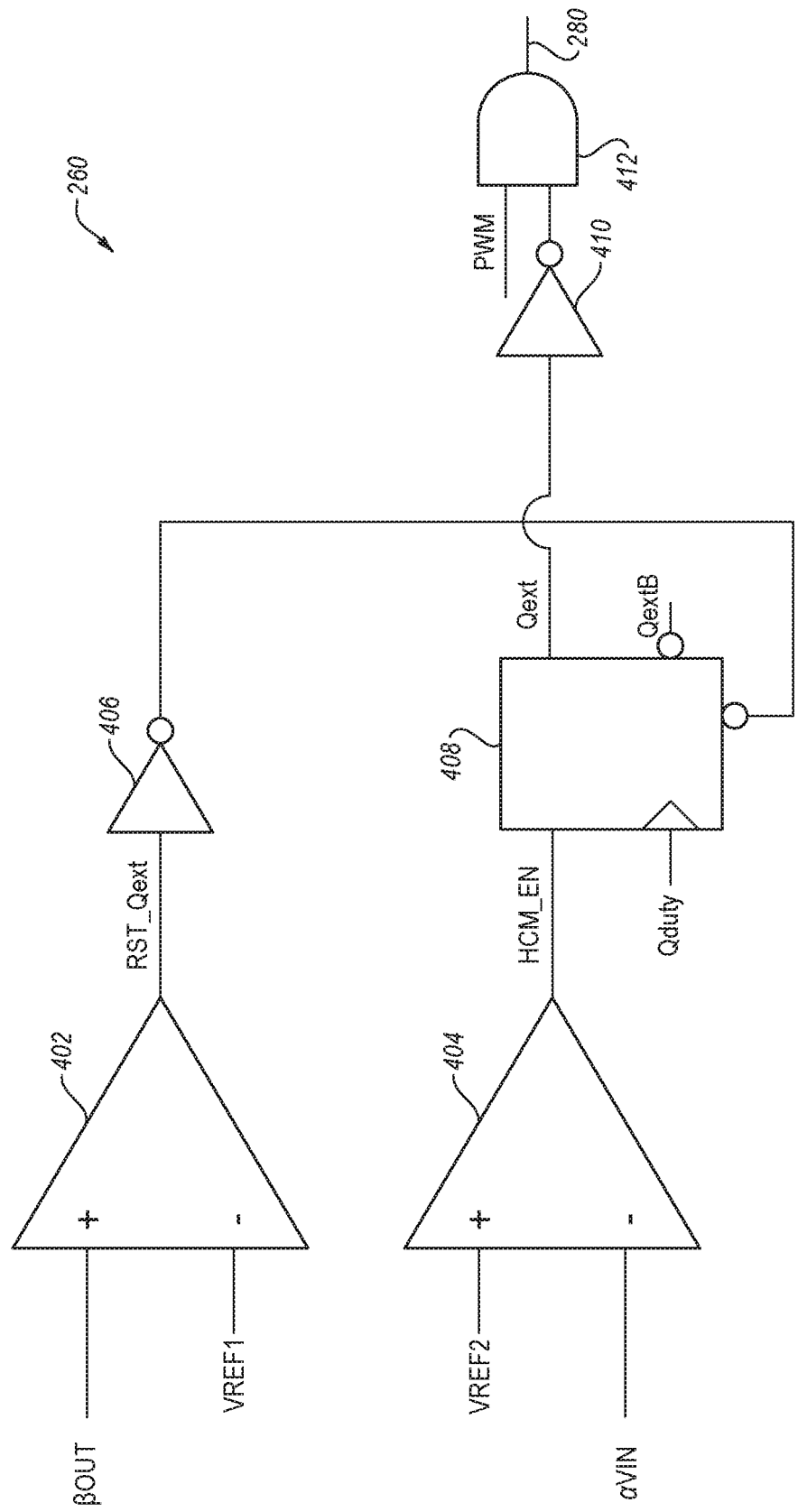
FIG. 4 illustrates a control unit, in accordance with various embodiments of the disclosure.

Further, according to various embodiments, adaptive duty controller power driver 202 includes a control unit 260. Control unit 260, which is described more fully below with reference to FIGS. 3 and 4, is configured to receive signal PWM (e.g., from comparator 220) and generate a control signal 280. Control signal 280 may be conveyed to pulse generator 212. According to some embodiments, control unit 260 may also be configured to receive one or more reference voltages VREF (e.g., including a voltage reference VREF1 and/or a voltage reference VREF2 (see FIG. 4)), a selected factor POUT of output voltage VOUT, and a selected factor $\alpha$VIN of input voltage VIN. As will be described more fully below, control unit 260 may initiate a hysteretic control mode (HCM), wherein, as noted above, and as described more fully below, a static signal may be conveyed to pulse generator 212 (i.e., rather than a PWM signal) to extend the on-duty time and reduce an amount of switching during bypass transitions (e.g., while voltage converter 200 transitions toward a bypass mode and/or after voltage converter 200 transitions out of the bypass mode). Therefore, the efficiency of voltage converter 200 may be improved.

It is noted that although control unit 260 is shown in FIG. 2 as integrated in a specific buck converter (i.e., voltage converter 200), control unit 260 may be compatible with other voltage converters and/or other voltage converter control topologies. For example, control unit 260 may be implemented with any suitable voltage converter wherein control unit 260 is configured to receive a PWM signal and other operating parameters (e.g., one or more voltages, such as an input voltage, an output voltage, and/or one or more reference voltages), and generate a control signal that may be conveyed to another component of a voltage converter, such as a pulse generator. For example, with reference to FIG. 3, a voltage converter 300 includes control unit 260, according to various embodiments of the disclosure. As shown in FIG. 3, control unit 260 is configured to receive a pulse-width modulation signal PWM and duty cycle signal Qduty, and generate control signal 280, which may be conveyed to another component 302 of a voltage converter, such as a pulse generator. According to various embodiments, control unit 260 may also be configured to receive one or more reference voltages (e.g., voltage reference VREF1 and voltage reference VREF2 of FIG. 4), a voltage $\alpha$VIN (e.g., a selected factor of an input voltage of the voltage converter), and a voltage $\beta$OUT (e.g., a selected factor of an output voltage of the voltage converter).

FIG. 4 is a more detailed illustration of control unit 260, according to various embodiments of the disclosure. As illustrated, control unit 260 includes a comparator 402 and a comparator 404. For example, each of comparator 402 and comparator 404 may include a low quiescent current (IQ) comparator, and, in some embodiments, one or more of comparator 402 and comparator 404 may be implemented via a Schmidt trigger comparator.

As will be appreciated, comparator 404 monitors a signal representative of input voltage VIN, which varies slowly, i.e., at low frequency, but is likely to have some small high-frequency noise superimposed. Thus, for comparator 404, chattering may be prevented via hysteresis. For a fixed a ratio and reference voltage VREF2, an amount of hysteresis of comparator 404 may determine a level of input voltage level VIN at which HCM will be disabled (i.e., with an increasing VIN) after HCM has been enabled (i.e., under decreasing VIN).

Further, as the switching of comparator 402 will be latched by flip-flop 408, hysteresis may not be necessary for comparator 402. However, a minimum amount of hysteresis to prolong a low pulse generated by inverter 406 may beneficial and may not impact circuit operation (e.g., since it takes a long time before another switching event of comparator 402 will be generated).

Comparator 402 is configured to receive voltage $\beta$OUT (i.e., a factor $\beta$ of output voltage VOUT (e.g., see FIG. 2)) at a non-inverting input thereof and a first reference voltage VREF1 at an inverting input thereof, and comparator 404 is configured to receive voltage $\alpha$VIN (i.e., a factor $\alpha$ of input voltage VIN (e.g., see FIG. 2)) at an inverting input thereof and a second reference voltage VREF2 at a non-inverting input thereof. According to some embodiments, first voltage reference VREF1 may be equal to second voltage reference VREF2 (e.g., the inverting input of comparator 402 and the non-inverting input of comparator 404 may be tied to a single reference voltage), as shown in FIG. 2 by a single voltage reference VREF, and in other embodiments, first voltage reference VREF1 and second voltage reference VREF2 may not be equal (i.e., comparators 402 and 404 are configured to receive different reference voltages). Further, in some embodiments, first voltage reference VREF1 and/or second voltage reference VREF2 may be equal to reference voltage VREF, as shown in FIG. 2.

Control unit 260 further includes inverter 406 coupled to an output of comparator 402, and a circuit 408 (e.g., also referred to herein as a flip-flop) coupled to an output of comparator 404. For example, circuit 408 may include a gated S-R flip-flop. In other embodiments an ungated S-R flip flop may be provided for circuit 408. Comparator 402 is configured to convey a signal RST_Qext to inverter 406, and inverter 406 is configured to convey a signal (e.g., a reset signal) to flip-flop 408. In addition to receiving a signal from inverter 406, flip-flop 408 is configured to receive a signal HCM_EN from the output of comparator 404 at a set input thereof and duty cycle signal Qduty at a clock input thereof. Flip-flop 408 is configured to generate outputs Qext and QextB, which are inverse signals of each other.

Additionally, control unit 260 includes an inverter 410 coupled to an output of flip-flop 408 and configured to receive output Qext. Control unit 260 further includes an AND gate 412 having one input coupled to an output of inverter 410, and another input configured to receive a PWM signal (e.g., from comparator 220 of FIG. 2). According to some embodiments, AND gate 412 may generate control signal 280, which may be conveyed to, for example, a pulse generator (e.g., pulse generator 212 of FIG. 2). In some embodiments, inverter 410 and AND gate 412 collectively may be referred to herein as a circuit.

As will be described more fully herein, in HCM, control signal 280 may be a control signal (e.g., a first control signal) having a static value (e.g., a low logic value), and in another mode (e.g., PFM mode), control signal 280 may be a control signal (e.g., a second, different control signal) that mirrors the PWM signal.

It is noted that control unit 260 is provided as an example control unit, and other possible configurations are within the scope of the disclosure. For example, inputs to comparator 402 may be reversed, and inverter 406 may be removed. Further, as another example, AND gate 412 may be replaced by one or more other logics gate (e.g., NANDs gate and/or NOR gates). In another example, inverter 410 may be removed and signal QextB may be coupled to AND gate 412. In yet another example, flip-flop 408 may not be necessary, and output Qext may be determined based on the outputs of comparators 402 and 404 and a lookup table (LUT).

In some embodiments, reference voltage VREF1 may be equal to an upper output voltage threshold (also referred to herein as an "activation voltage" or "transition voltage"). For example, for a target output voltage of 3.3 volts, an upper output voltage threshold may be about 3.414 volts (103.45% of 3.3 volts). Further, a lower output voltage threshold may include a voltage equal to or near a value of a target output voltage (also referred to herein as a "normal nominal output voltage"), such as 3.3 volts. Moreover, in some embodiments, second reference voltage VREF2 may be equal to an input voltage threshold (also referred to herein as an "activation voltage" or "transition voltage"). For the example having a target output voltage of 3.3 volts, an input voltage threshold (i.e., second reference voltage VREF2) may be about 3.6 volts (e.g., 109.09% of 3.3 volts). In this example, if voltage VIN is greater than the input voltage threshold, a PFM mode may be used (i.e., control signal 280 mirrors PWM signal), and if voltage VIN decreases to or below the input voltage threshold, a HCM may be used (i.e., control signal 280 is a static (e.g., low) value).

More specifically, for example, the HCM may be activated in response to voltage αVIN becoming equal to or dropping below a first activation voltage (i.e., the input voltage threshold), thus setting signal HCM_EN high. When HCM_EN is high, upon the next rising edge of Qduty, output Qext will be high, thus setting control signal 280 to be low irrespective of signal PWM. The use of the next rising edge of Qduty to clock flip-flop 408 ensures synchronous operation, however if synchronous operation is not required, HCM may activated asynchronously responsive to voltage αVIN becoming equal to or dropping below the first activation voltage. If voltage βOUT increases to above a second activation voltage (i.e., the upper output voltage threshold (e.g., 3.414 volts)), duty cycle signal Qduty may be reset. More specifically, if voltage βOUT increases to above the second activation voltage, flip-flop 408 will be reset, since the reset input is not clocked, and output Qext will transition low, and thus AND gate 412 will pass received signal PWM to control signal 280, and in response to signal PWM transitioning high, flip-flop 250 (see FIG. 2) may be reset. If output voltage VOUT (see FIG. 2) does not increase to above the second activation voltage, typically due to VIN being insufficiently high under the present loading conditions to accomplish same, flip-flop 408 is not reset and voltage converter 200, 300 maintains the high-side transistor 234 ON irrespective of the state of control signal TON generated via timer 242 of FIG. 2. When VIN drops such that on-duty generator 214 provides a 100% duty cycle, i.e., TON is set to a fixed high signal, the bypass mode has been entered from the HCM mode.

More specifically, with reference to FIGS. 2 and 4, during a contemplated operation, if voltage αVIN is greater than second reference voltage VREF2, voltage converter 200 may operate in PFM mode. Further, in response to voltage αVIN becoming equal to or less than second reference voltage VREF2 (the "first activation voltage"), voltage converter 200 may transition from the PFM mode to a HCM (i.e., signal HCM_EN may be asserted and output Qext may transition high upon the following rising edge of signal Qduty, the output of inverter 410 may be low, and thus control signal 280 is a static value). Further, in response to an "on-duty request" (i.e., via timer 242), control signal TON may transition high and signal Qduty may transition high (i.e., until flip-flop 250 is reset via a PWM signal conveyed via control unit 260).

Thus, VIN falling below the input voltage threshold VREF2, the HCM mode is enabled. In the event that VIN is sufficient, under present loading conditions, to support a VOUT greater than the upper output voltage threshold VREF2, voltage converter 200, 300 will revert back to PFM mode when VOUT has risen to be greater than the upper output voltage threshold VREF2. This cycle will repeat on every rising edge of Qduty, unless VIN has risen above the input voltage threshold VREF2. In the event that VIN is not sufficient, under present loading conditions, to support a VOUT greater than the upper output voltage threshold VREF2, voltage converter 200, 300 is held with the high side switch high, in the HCM mode, until VIN drops such that on-duty generator 214 provides a 100% duty cycle, i.e., TON is set to a fixed high signal, and the bypass mode has been entered from the HCM mode. In both the bypass mode and HCM, high-side transistor 234 is continuously ON and a 100% duty cycle is achieved. In other words, while operating in HCM, if output voltage VOUT does not recover to above the upper output voltage threshold VREF1, flip-flops 408 and 250 will not be reset, and thus high-side transistor 234 will remain ON (i.e., in a conductive state). Further, in response to input voltage VIN increasing to a level sufficient to support output voltage VOUT being greater than the upper output voltage threshold VREF1 (e.g., 103.45% of the target output voltage), voltage converter 200, based on control signal TON and signal RST_Qext, may transition out of the bypass mode into the PFM.

Thus, in response to voltage βOUT becoming equal to or greater than first reference voltage VREF1 (the "second activation voltage"), voltage converter may transition from the HCM, or bypass mode, to PFM mode. More specifically, in response to voltage βOUT becoming equal to or greater than first reference voltage VREF1, signal RST_Qext may transition high, flip-flop 408 may be reset, and therefore output Qext may transition low upon the following rising edge of signal Qduty, which will allow AND gate 412 to pass signal PWM such that control signal 280 may include (i.e., mirror) signal PWM, and duty cycle signal Qduty may be reset.

With reference to FIGS. 2 and 4, a contemplated operation of voltage converter 200, and more specifically control unit 260, will now be described. In this example, a lower output voltage threshold ("target output voltage") is equal to 3.3 volts, reference voltage VREF1 is equal to β*3.414 volts, and reference voltage VREF2 is equal to α*3.6 volts.

In this example, if voltage αVIN is greater than α*3.6 volts, signal HCM_EN is low, and thus output Qext is low, control signal 280 may include (i.e., mirror) signal PWM, and voltage converter 200 is operating in the PFM mode. Further, if voltage αVIN becomes less than or equal to α*3.6 volts, signal HCM_EN may transition high, output Qext may transition high, control signal 280 will be low, and voltage converter 200 may operate in the HCM. It is noted that during HCM, high-side transistor 234 is ON (i.e., based on control signal TON going high, which set Qduty high so as to clock flip-flop 408) and control signal 280 is a static value (i.e., signal PWM is not conveyed to pulse generator 212 of FIG. 2). Thus, during the HCM (e.g., when voltage converter 200 is transitioning toward a bypass mode), an "on-duty" time may continue and current consumption may decrease due to the decrease of switching activity.

Further, in response to output voltage VOUT becoming less than 3.3 volts (e.g., due to input voltage VIN decreasing and/or a load increasing), voltage converter 200, based on a high control signal TON, may transition from the HCM to a bypass mode, wherein high-side transistor 234 will be ON (i.e., in a conductive state), however it is to be noted that high-side transistor 234 is already ON, due to the HCM mode. Thus, HCM may be considered an extended bypass mode.

Continuing with this example, in an embodiment wherein VOUT is further provided to timer 242, in response to output voltage VOUT increasing to or greater than 3.3 volts, voltage converter 200, based on a logic low control signal TON (e.g., based on a signal generated via timer 242), may transition from the bypass mode to the HCM. In this example, because flip-flop 408 is not reset, output Qext is still high, since Qduty has not transitioned, control signal 280 is still low, flip-flop 250 is not reset, and thus high-side transistor 234 may remain ON. Thus, during the HCM (i.e., after voltage converter 200 transitions out of the bypass mode and toward the PFM mode), current consumption may decrease due to the lack of switching activity. In summary, during the HCM transition from bypass mode, voltage converters 200, 300 acts to extend the bypass mode by utilizing the HCM.

Further, in response to voltage βOUT becoming greater than β*3.414, signal RST_Qext may transition high, flip-flop 408 may be reset, output Qext may go low, and thus control signal 280 will include (i.e., mirror) signal PWM. Further, flip-flop 250 may be reset, and voltage converter 200 may transition from the HCM to a PFM mode. It is noted that in the configuration shown in FIG. 2 (e.g., a buck converter), output voltage VOUT may not be greater than input voltage VIN, and thus signal RST_Qext may not transition high while signal HCM_EN is high.

The above has been described in an embodiment wherein control unit 260 is separate from on-duty generator 214. In another embodiment, control unit 260 is integrated within on-duty generator 214. In such an embodiment, the HCM and bypass modes are not separately defined. The operation of comparators 402 and 404, flip-flop 408, inverter 410 and AND gate 412 may be implemented within on-duty generator 214, or may be provided as part and parcel of the logic of on-duty generator 214.

Figure 5:
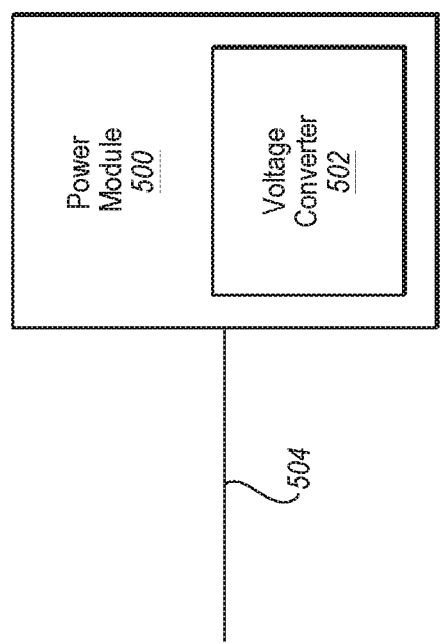
FIG. 5 a block diagram of a power module including a voltage converter, according to one or more embodiments of the disclosure.

As will be appreciated, HCM, which may be suitable for light loads, may increase efficiency during bypass transitions. However, in some cases, HCM may slightly increase an output voltage ripple. Thus, it may be desirable for an end-user to consider tradeoffs of HCM, and according to some embodiments, a voltage converter may be enabled for operating in a HCM by the end-user (e.g., via a register bit and/or an I²C bus—control not shown). For example, FIG. 5 illustrates a power module 500 including a voltage converter 502, in accordance with various embodiments of the present disclosure. Voltage converter 502 may include voltage converter 200 as shown in FIG. 2 or voltage converter 300 shown in FIG. 3. According to some embodiments, power module 500 may include one or more inputs used for configuring voltage converter 502, and more specifically, enabling a control unit (e.g., control unit 260 of FIG. 2) of voltage converter 502. For example, power module 500 may receive one or more inputs via a bus 504 (e.g., an I²C bus) (e.g., to set one or more bits) for enabling a control unit (e.g., control unit 260 of FIG. 2) voltage converter 502 to operate in a HCM, as described herein.

Further, according to various embodiments, threshold voltages of a control unit (e.g., control unit 260 of FIG. 4) may be settable, and thus activation and/or transition points (also referred to herein as activation and/or transition voltages) of the control unit may be programmable. Programmable activation points may provide for predictable input-to-output differential, which may prevent rapid inductor current build-up and reduce sensitivity to regulation comparator delays. In at least these embodiments, an end user may consider tradeoffs (e.g., efficiency versus performance) at an application level to determine whether the HCM is desirable, and if so, which settings are desired.

Figure 6:
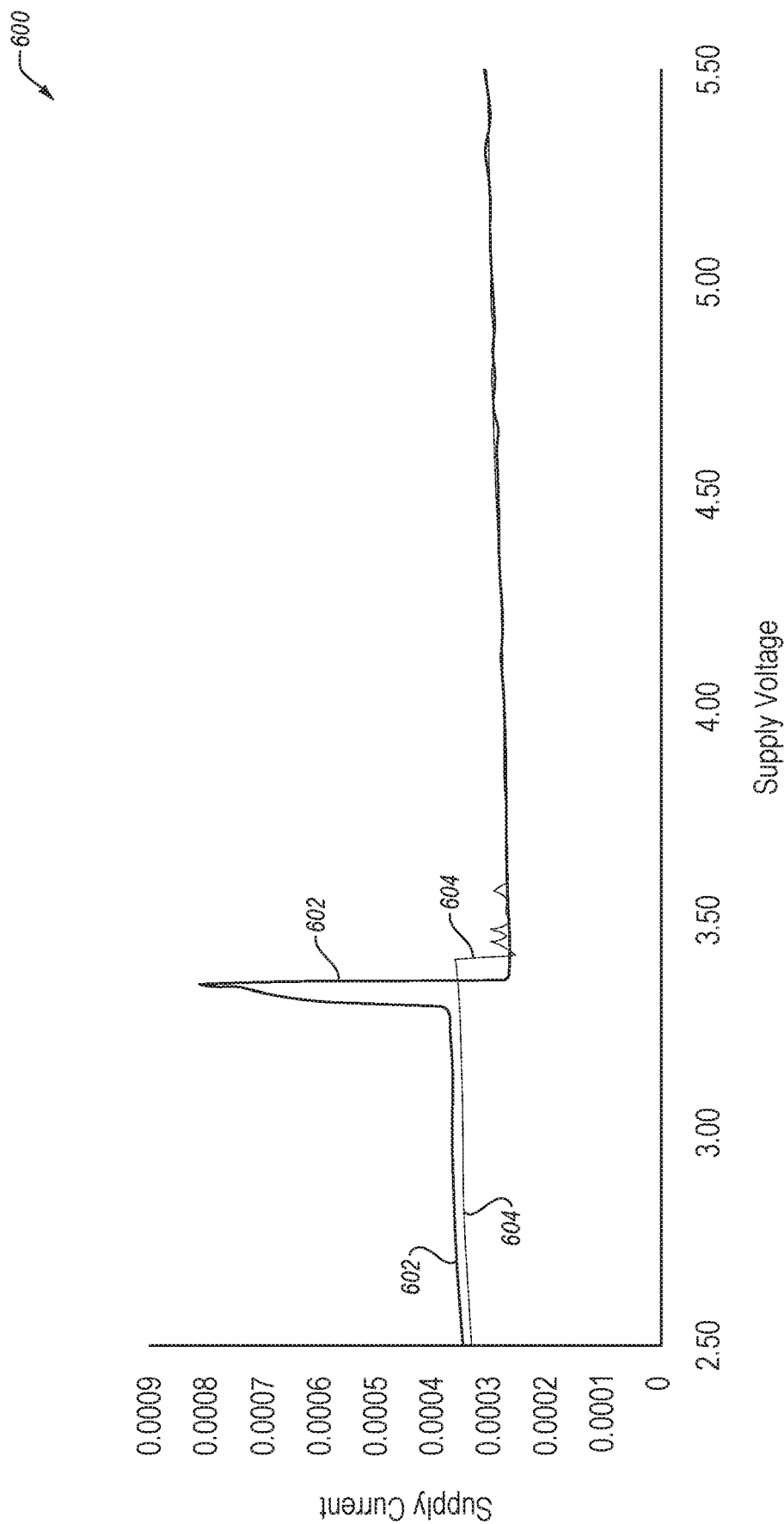
FIG. 6 shows a plot including a waveform indicative of a voltage converter supply current across a supply voltage, in accordance with one or more embodiments of the disclosure.

FIG. 6 shows a plot 600 including a waveform indicative of a supply current across a supply voltage for a voltage converter, in accordance with one or more embodiments of the disclosure. More specifically, plot 600 includes a waveform 602 of a supply current across a supply voltage for a voltage converter without utilizing a HCM. Further, plot 600 includes a waveform 604 of a supply current across a supply voltage for a voltage converter (e.g., voltage converter 200) utilizing a HCM. As shown in plot 600, a voltage converter utilizing a HCM (e.g., during a bypass transition) may exhibit a substantial improvement in efficiency compared to a voltage converter that does not utilize a HCM.

Figure 7A:
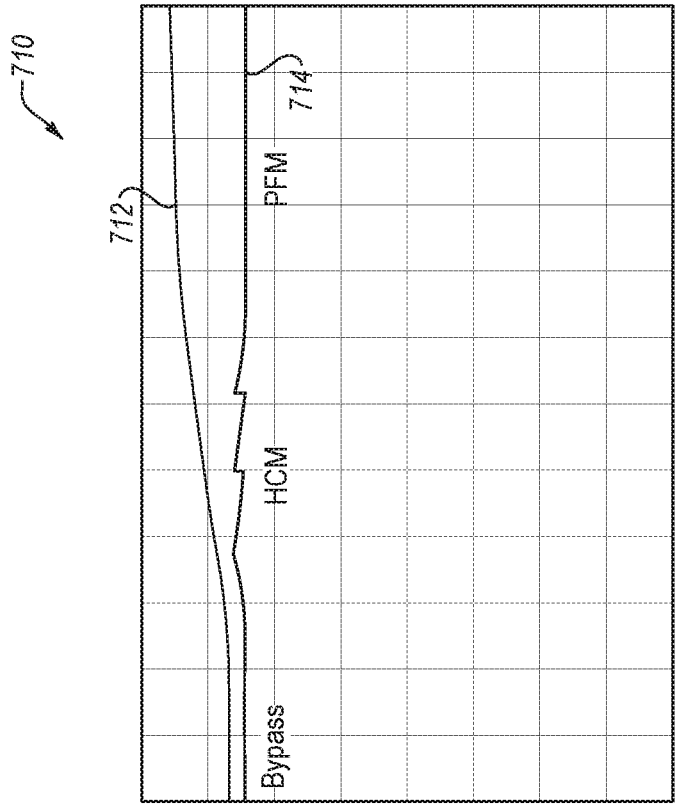
FIG. 7A shows a plot depicting various parameters of a voltage converter transitioning into a bypass mode, in accordance with one or more embodiments of the disclosure.

FIG. 7A shows a plot 700 depicting various parameters of a voltage converter transitioning into and out of a HCM. More specifically, plot 700 includes a waveform 702 indicative of an input voltage (e.g., input voltage VIN of FIG. 2), and a waveform 704 indicative of an output voltage (e.g., output voltage VOUT of FIG. 2). As shown in plot 700, as the input voltage decreases (e.g., from 3.8V to 3.3V), the voltage converter transitions from a PFM mode, through a HCM, and then to a bypass mode where a high-side transistor (e.g., transistor 234 of FIG. 2) is continuously ON.

Figure 7B:
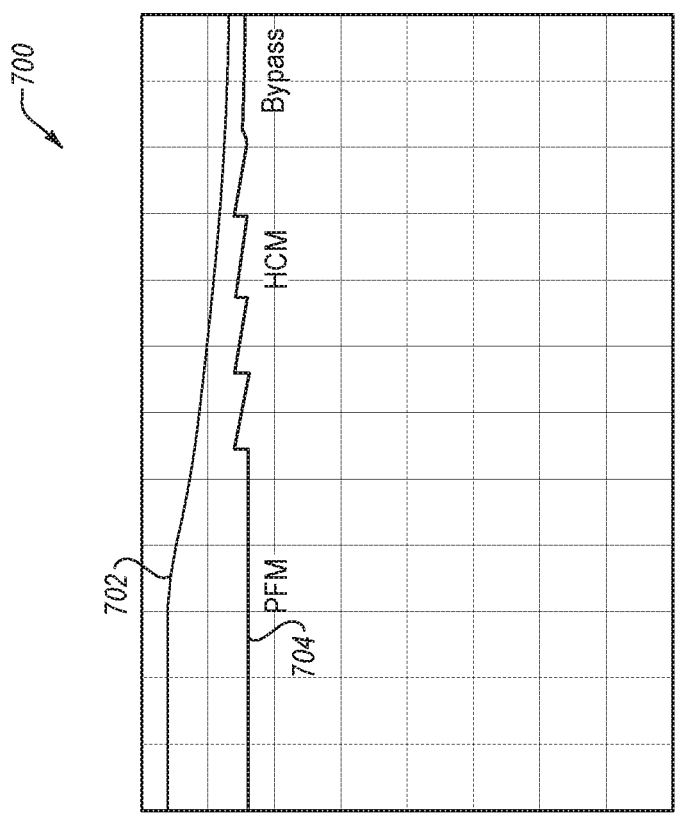
FIG. 7B shows a plot depicting various parameters of a voltage converter transitioning out of a bypass mode, according to one or more embodiments of the disclosure.

FIG. 7B shows another plot 710 depicting various parameters of a voltage converter transitioning into and out of a HCM. More specifically, plot 710 includes a waveform 712 indicative of an input voltage (e.g., input voltage VIN of FIG. 2), and a waveform 714 indicative of an output voltage (e.g., output voltage VOUT of FIG. 2). As shown in plot 710, as the input voltage increases (e.g., from 3.3V to 3.8V), the voltage converter transitions from a bypass mode, through a HCM, and then to a PFM mode.

Figure 8:
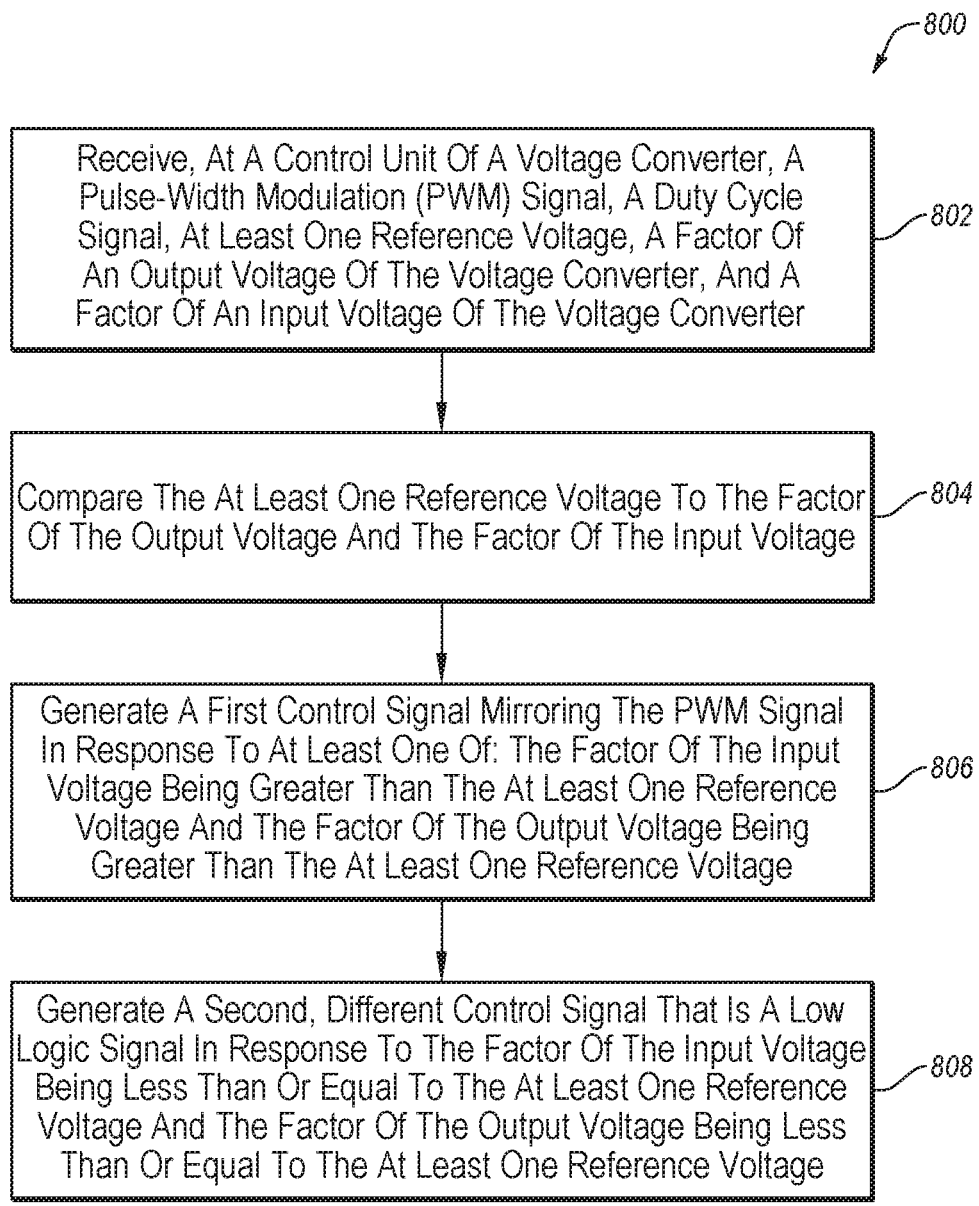
FIG. 8 is a flowchart of an example method of operating a voltage converter, according to one or more embodiments of the disclosure.

FIG. 8 is a flowchart of an example method 800 of operating a voltage converter, in accordance with various embodiments of the disclosure. Method 800 may be performed, in some embodiments, by a device or system, such as voltage converter 200 of FIG. 2, control unit 260 of FIGS. 2, 3, and 4, voltage converter 300 of FIG. 3, and/or power module 500 of FIG. 5, or another device or system. Although illustrated as discrete blocks, various blocks may be divided into additional blocks, combined into fewer blocks, or eliminated, depending on the desired implementation.

At block 802, one or more signals may be received at a control unit of a voltage converter, and method 800 may proceed to block 804. For example, at least one of a PWM signal (e.g., signal PWM of FIG. 4), a duty cycle signal (e.g., duty cycle signal Qduty of FIG. 4), at least one reference voltage (e.g., first reference voltage VREF1, and/or second reference voltage VREF2 of FIG. 2), a factor (e.g., voltage βOUT of FIG. 4) of an output voltage (e.g., output voltage VOUT of FIG. 2) of the voltage converter, and/or a factor (e.g., voltage αVIN of FIG. 4) of an input voltage (e.g., input voltage VIN of FIG. 2) of the voltage converter may be received at the control unit (e.g., control unit 260 of FIG. 4).

At block 804, the at least one reference voltage may be compared to the factor of the output voltage and the factor of the input voltage, and method 800 may proceed to block 806. More specifically, for example, a first comparator (e.g., comparator 402 of FIG. 4) may compare a first reference voltage (e.g., reference voltage VREF1) to voltage βOUT, and a second comparator (e.g., comparator 404 of FIG. 4) may compare a second reference voltage (e.g., reference voltage VREF2) to voltage αVIN.

At block 806, a first control signal which mirrors the PWM signal may be generated in response to at least one of: the factor of the input voltage being greater than the at least one reference voltage and the factor of the output voltage being greater than the at least one reference voltage, and method 800 may proceed to block 808. More specifically, for example, the first control signal may be generated in response to at least one of: voltage αVIN being greater than the second reference voltage (e.g., second reference voltage VREF2) and voltage βOUT being greater than the first reference voltage (e.g., first reference voltage VREF1). For example, AND gate 412 of FIG. 4 may generate control signal 280 mirroring the PWM signal in response to PWM signal and a high signal generated by inverter 410.

At block 808, a second, different control signal including a static signal, which in one embodiment is a low logic signal, may be generated in response to the factor of the input voltage being less than or equal to the at least one reference voltage. More specifically, for example, the second, different control signal may be generated in response to both voltage αVIN being less than or equal to the second reference voltage (e.g., second reference voltage VREF2) and voltage βOUT being less than or equal to the first reference voltage (e.g., first reference voltage VREF1). For example, AND gate 412 of FIG. 4 may generate control signal 280 at a static low state in response to a low signal generated by inverter 410.

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, the control signal (e.g., control signal 280 of FIG. 4) may be conveyed to another component within a voltage converter, such as a pulse generator (e.g., pulse generator 212 of FIG. 2). Further, for example, a duty cycle signal (e.g., duty cycle signal Qduty) may be generated (e.g., via a pulse generator) based on one of the first control signal and the second control signal. Moreover, a duty cycle of the voltage converter may be set based on the generated duty cycle signal. As another example, the control unit may be activated and/or programmed based on one or more signals received via a bus (e.g., bus 504 of FIG. 5).

One of ordinary skill in the art will recognize that various embodiments of the disclosure have many advantages, including, but not limited to, decreasing switching in a voltage converter. Therefore, various embodiments may reduce quiescent current and improve performance of a voltage converter, which may lead to extended battery life of an associated device. Further, one of ordinary skill in the art will recognize that the embodiments described may be applicable to various voltage converters (e.g., buck converters, boost converters, buck-boost converters, among others). Further, various embodiments may be particularly useful with, though not limited to, portable applications, such as applications in mobile devices or the Internet of Things (IoT) that may need robust, highly efficient, and cost-effective regulators. Further, various embodiments may be useful with high-performance voltage regulators, as required by various microcontroller or microprocessor cores. A voltage converter, including various embodiments disclosed herein, may exhibit a high conversion efficiency and/or high output voltage accuracy, as desired for portable devices, microcontrollers, and/or microprocessor cores.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, without limitation) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A voltage converter, comprising:
   a control unit including:
      a first comparator configured to receive at least one reference voltage and a factor of an output voltage of the voltage converter, and generate a first signal;
      a second comparator configured to receive the at least one reference voltage and a factor of an input voltage of the voltage converter, and generate a second signal;
      a circuit configured to receive the first signal, the second signal, and a duty cycle signal, and generate a third signal; and
      a logic gate configured to receive a first pulse-width modulation (PWM) signal and the third signal, and generate a control signal; and
   a pulse generator configured to receive the control signal and generate the duty cycle signal based on the control signal.

2. The voltage converter of claim 1, wherein the control signal mirrors the PWM signal in response to at least one of the factors of the input voltage being greater than the at least one reference voltage and the factor of the output voltage being greater than the at least one reference voltage.

3. The voltage converter of claim 1, wherein the control signal comprises a static logic signal in response to the factor of the input voltage being less than or equal to the at least one reference voltage and the factor of the output voltage being less than or equal to the at least one reference voltage.

4. The voltage converter of claim 1, wherein the control signal mirrors the PWM signal in response to the factor of the output voltage being greater than the at least one reference voltage.

5. The voltage converter of claim 1, wherein the control signal mirrors the PWM signal during a pulse-frequency modulation (PFM) mode.

6. The voltage converter of claim 1, wherein the control signal comprises a static logic signal during a bypass mode and a hysteretic control mode.

7. The voltage converter of claim 1, wherein the at least one reference voltage comprises a first reference voltage and a second, different reference voltage, wherein the first comparator is configured to receive the first reference voltage and the second comparator is configured to receive the second, different reference voltage.

8. A voltage converter, comprising:
   a control unit configured to:
      receive a pulse-width modulation (PWM) signal, a duty cycle signal, at least one reference voltage, a factor of an output voltage of the voltage converter, and a factor of an input voltage of the voltage converter;
      compare the at least one reference voltage to each of the factor of the output voltage and the factor of the input voltage;
      generate a first control signal mirroring the PWM signal in response to at least one of the factors of the input voltage being greater than the at least one reference voltage and the factor of the output voltage being greater than the at least one reference voltage; and
      generate a second, different control signal as a static logic signal in response to the factor of the input voltage being less than or equal to the at least one reference voltage.

9. The voltage converter of claim 8, wherein the control unit comprises:
   a first comparator configured to receive the at least one reference voltage and the factor of the output voltage;
   a second comparator configured to receive the at least one reference voltage and the factor of the input voltage;
   a first inverter having an input configured to receive an output of the first comparator;
   a flip-flop having a first input configured to receive an output of the second comparator, a second input configured to receive an output of the first inverter, and a third input configured to receive the duty cycle signal;
   a second inverter configured to receive an output of the flip-flop; and
   an AND gate having a first input configured to receive the PWM signal and a second input configured to receive an output of the second inverter.

10. The voltage converter of claim 8, wherein the control unit comprises:
    a first comparator configured to receive the at least one reference voltage and the factor of the output voltage and generate a first signal;
    a first inverter configured to receive the first signal and generate a second signal;
    a second comparator configured to receive the at least one reference voltage and the factor of the input voltage and generate a third signal;
    a flip-flop configured to receive the second signal, the third signal, and the duty cycle signal, and generate a fourth signal;
    a second inverter configured to receive the fourth signal and generate a fifth signal; and
    an AND gate configured to receive the PWM signal and the fifth signal and generate a control signal.

11. The voltage converter of claim 8, further comprising a pulse generator configured to generate the duty cycle signal based on one of the first control signal and the second, different control signal.

12. The voltage converter of claim 11, wherein the pulse generator includes:
- a first NAND gate configured to receive the duty cycle signal and a third control signal;
- a second NAND gate configured to receive an output of the first NAND gate and one of the first control signal and the second, different control signal; and
- a second flip-flop configured to receive an output of the second NAND gate and generate the duty cycle signal.

13. The voltage converter of claim 8, wherein the at least one reference voltage comprises a first reference voltage and a second reference voltage.

14. The voltage converter of claim 13, wherein the control unit is configured to compare the first reference voltage to the factor of the output voltage and the second reference voltage to the factor of the input voltage.

15. A method of operating a voltage converter, comprising:
- receiving, at a control unit of a voltage converter, a pulse-width modulation (PWM) signal, a duty cycle signal, at least one reference voltage, a factor of an output voltage of the voltage converter, and a factor of an input voltage of the voltage converter;
- comparing, via the control unit, the at least one reference voltage to each of the factor of the output voltage and the factor of the input voltage;
- generating, via the control unit, a first control signal mirroring the PWM signal in response to at least one of the factors of the input voltage being greater than the at least one reference voltage and the factor of the output voltage being greater than the at least one reference voltage; and
- generating, via the control unit, a second, different control signal as a static logic signal in response to the factor of the input voltage being less than or equal to the at least one reference voltage and the factor of the output voltage being less than or equal to the at least one reference voltage.

16. The method of claim 15, further comprising generating the duty cycle signal based on one of the first control signal and the second, different control signal.

17. The method of claim 15, further comprising conveying one of the first control signal and the second, different control signal to a pulse generator.

18. The method of claim 15, further comprising enabling the control unit based on a signal received via a bus.

19. The method of claim 15, wherein generating the first control signal comprises: receiving the PWM signal and a logic high signal at an AND gate; and outputting the first control signal from the AND gate.

20. The method of claim 15, wherein generating the second, different control signal comprises: receiving the PWM signal and a logic low signal at an AND gate; and outputting the second, different control signal from the AND gate.

* * * * *